(12) United States Patent
Bao et al.

(10) Patent No.: US 10,636,737 B2
(45) Date of Patent: Apr. 28, 2020

(54) STRUCTURE AND METHOD OF METAL WRAPAROUND FOR LOW VIA RESISTANCE

(71) Applicant: QUALCOMM Incorporated, San Diego, CA (US)

(72) Inventors: Junjing Bao, San Diego, CA (US); Jie Deng, San Diego, CA (US); John Zhu, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/106,679

(22) Filed: Aug. 21, 2018

(65) Prior Publication Data

US 2020/0066630 A1 Feb. 27, 2020

(51) Int. Cl.
| H01L 23/522 | (2006.01) |
| H01L 21/768 | (2006.01) |
| H01L 23/528 | (2006.01) |
| H01L 21/311 | (2006.01) |
| H01L 21/02 | (2006.01) |
| H01L 21/8234 | (2006.01) |
| H01L 23/532 | (2006.01) |

(52) U.S. Cl.
CPC ...... *H01L 23/5226* (2013.01); *H01L 21/0214* (2013.01); *H01L 21/0217* (2013.01); *H01L 21/02126* (2013.01); *H01L 21/02164* (2013.01); *H01L 21/02274* (2013.01); *H01L 21/31111* (2013.01); *H01L 21/31144* (2013.01); *H01L 21/76802* (2013.01); *H01L 21/76877* (2013.01); *H01L 21/823475* (2013.01); *H01L 23/5283* (2013.01); *H01L 21/02167* (2013.01); *H01L 21/76805* (2013.01); *H01L 21/76807* (2013.01); *H01L 21/76892* (2013.01); *H01L 21/76897* (2013.01); *H01L 21/823431* (2013.01); *H01L 23/528* (2013.01); *H01L 23/53209* (2013.01); *H01L 23/53228* (2013.01); *H01L 23/53242* (2013.01); *H01L 23/53257* (2013.01); *H01L 2221/1015* (2013.01)

(58) Field of Classification Search
CPC ....... H01L 2221/1015; H01L 21/76877; H01L 21/76802; H01L 21/76805; H01L 21/76807; H01L 21/76892; H01L 21/76897; H01L 23/5226; H01L 23/528; H01L 23/5283
See application file for complete search history.

(56) References Cited

U.S. PATENT DOCUMENTS

| 1,020,224 | A | * | 3/1912 | Saklatwalla | ........... C01G 31/00 423/65 |
| 8,659,944 | B2 | * | 2/2014 | Hung | ................. G11C 16/0466 365/185.05 |
| 10,395,984 | B2 | * | 8/2019 | Backes | ............. H01L 21/76885 |
| 2013/0082393 | A1 | * | 4/2013 | Kawamura | ....... H01L 21/28568 257/773 |
| 2016/0163587 | A1 | * | 6/2016 | Backes | ............... H01L 21/2885 257/751 |

\* cited by examiner

*Primary Examiner* — David A Zarneke
(74) *Attorney, Agent, or Firm* — Qualcomm Incorporated (57) ABSTRACT

A semiconductor device includes a contact via and a metal interconnect on the contact via. The metal interconnect has a portion extending in a lengthwise direction that is wrapped around and in contact with a sidewall of the contact via. Along a widthwise direction, the metal interconnect does not contact the sidewall of the contact via.

5 Claims, 11 Drawing Sheets

STRUCTURE AND METHOD OF METAL WRAPAROUND FOR LOW VIA RESISTANCE

BACKGROUND

Field

Aspects of the present disclosure relate to semiconductor devices, and more particularly to a metal wraparound structure for low contact via resistance.

Background

As integrated circuit (IC) technology advances, device geometries are reduced, and additional device structures are added to an integrated circuit. Reducing the geometry and "pitch" (spacing) between devices may cause devices to interfere with each other in terms of proper operation.

The performance of these semiconductor devices can be affected by numerous factors. One factor that contributes to external resistance is contact resistance between a contact via connecting a middle-of-line (MOL) contact with a back-end-of-line (BEOL) conductive layer (e.g., metal interconnect), in particular between the last MOL layer CA and the first BEOL metal M1. Contact resistance is a device performance and scaling limiter for advanced technology nodes in which the geometry and pitch between devices is dramatically reduced. A reduced contact resistance is desired to continue support of improved device performance and density scaling for advanced logic technology, such as 7 nm logic technology and beyond.

SUMMARY

A semiconductor device includes a contact via. The semiconductor device also includes a metal interconnect on the contact via. The metal interconnect has a portion extending in a lengthwise direction that is wrapped around an in contact with a sidewall of the contact via. Along a widthwise direction, the metal interconnect does not contact the sidewall of the contact via.

A method of fabricating a semiconductor device including a metal wrap-around structure includes providing a substrate having completed middle-of-line processes, the substrate including a first etch stop layer. The method further includes depositing a first dielectric material on a first etch stop layer and a second dielectric material on the first dielectric material. The second dielectric material has a different etch selectivity than the first dielectric material. The method further includes forming a contact via in the first dielectric material and the second dielectric material, and removing the second dielectric material to expose a top surface and a portion of a sidewall of the contact via. The method further includes depositing a second etch stop layer on the first dielectric material and the contact via, and depositing a third dielectric material on the second etch stop layer. The method further includes etching the third dielectric material and the second etch stop layer to form an opening for a metal interconnect. The opening exposes the top surface and the portion of the sidewall of the contact via. The method further includes depositing a metal in the opening to form the metal interconnect. The metal interconnect has a portion extending in a lengthwise direction that is wrapped around and in contact with the sidewall of the contact via. Along a widthwise direction, the metal interconnect does not contact the sidewall of the contact via.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of an aspect of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front-end-of-line (FEOL), a middle-of-line (MOL) and a back-end-of line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the source/drain regions of the FEOL devices using non-silicide/non-geminide contact. These interconnects may be fabricated with a dual damascene process using plasma-enhanced chemical vapor deposition (PECVD) deposited inter-layer dielectric (ILD) materials.

As integrated circuit (IC) technology advances, device geometries are reduced. The geometry and pitch between devices has substantially reduced in advanced logic technology. Metal minimum area has reduced to support standard cell area scaling. As a result, in local interconnect levels of advanced technology nodes, such as seven nanometer logic technology and beyond, the dual damascene process that forms the metal trench and via in one step is being replaced with a single damascene process that forms the metal trench and via in separate steps.

The performance of semiconductor devices can be affected by numerous factors. One substantial factor that contributes to external resistance is contact resistance between a contact via connecting a MOL contact with a BEOL conductive layer (e.g., metal interconnect), particularly between the last MOL layer CA and the first BEOL metal M1. Contact resistance is a device performance and scaling limiter for advanced technology nodes. A reduced contact resistance is desired to continue support of improved device performance and density scaling for advanced logic technology, such as 7 nm logic technology and beyond.

Various aspects of the disclosure provide techniques for fabricating a metal wrap-around structure for semiconductor devices to drastically reduce contact resistance. The process flow for semiconductor fabrication of the metal wraparound structure may include MOL processes and BEOL processes. A metal wraparound structure may enable operation with the reduced device geometries of advanced logic technology, such as 7 nm logic technology and beyond. It will be understood that the term "layer" includes film and is not to be construed as indicating a vertical or horizontal thickness unless otherwise stated. As described herein, the term "substrate" or may refer to a substrate of a diced wafer or may refer to the substrate of a wafer that is not diced. Similarly, the terms wafer and die may be used interchangeably unless such interchanging would tax credulity.

Figure 1:
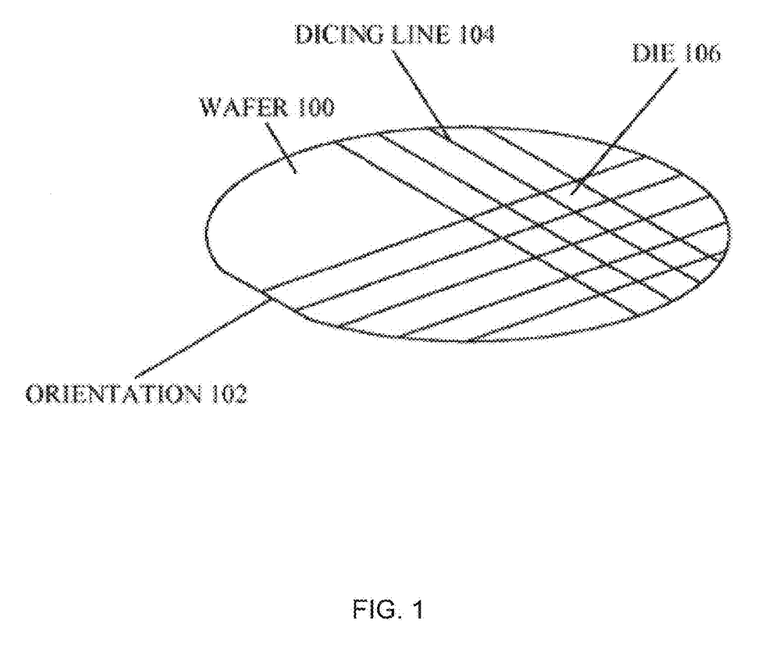
FIG. 1 illustrates a perspective view of a semiconductor wafer in an aspect of the present disclosure.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and €, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to l. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
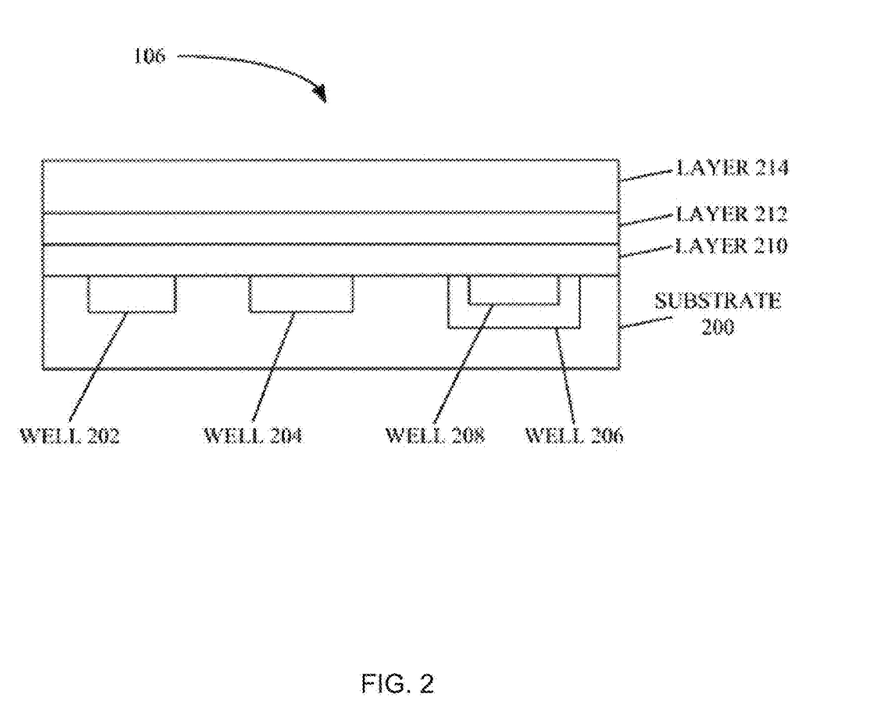
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical, electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3A:
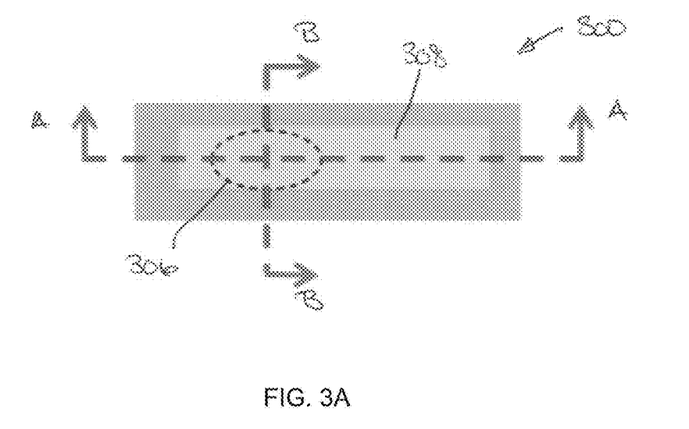
FIG. 3A is a top plan view of a portion of a conventional semiconductor device showing a metal interconnect on top of a contact via.
Figure 3B:
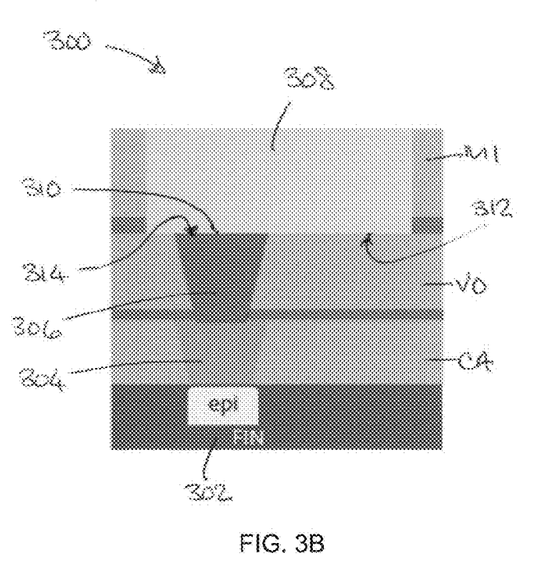
FIGS. 3B and 3C are cross-sectional views taken generally along the lines A-A and B-B, respectively, of FIG. 3A.
Figure 3C:
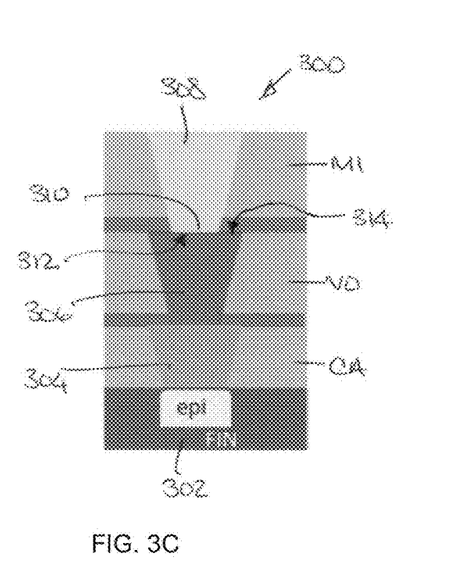

FIGS. 3A-3C illustrate a portion of a conventional semiconductor device 300. FIG. 3A is a top plan view, while FIGS. 3B and 3C are cross-sectional views taken generally along the lines A-A and B-B, respectively, of FIG. 3A. The semiconductor device 300 may include a FinFET 302 that is formed using FEOL processes. The FinFET 302, which is formed in the substrate 200 (see FIG. 2), includes a source (not shown) and a drain (not shown) that may be fabricated as the wells 202 and 204 in the substrate 200 of FIG. 2. Other structures of the FinFET 302, such as a gate and a fin, may be fabricated as areas above the substrate 200, or as part of other layers (e.g., 210-214) on the die 106.

To connect to the FinFET 302, or to interconnect to other components on the semiconductor device 300, contact vias and interconnect traces or layers are used. For example, the semiconductor device 300 may include a contact 304, formed using a MOL process, and a contact via 306 that connects the FinFET 302 to a metal interconnect 308. The metal interconnect 308 may be an interconnect trace formed using BEOL processes in one or more of layers (e.g., 210-214), of the die 106.

The contact via 306 is in a metal interconnect layer VO located between the last MOL layer CA and the first BEOL layer M1. The contact via 306 and the metal interconnect 308 are commonly formed using a dual damascene process, which is characterized by patterning the vias and trenches in such a way that the metal deposition fills both at the same time. However, with the move to more advanced technology nodes, a single damascene process may be used to form each layer (e.g., metal interconnect layers VO and M1) on its own. If copper is used for the contact via 306 and the metal interconnect 308, then a thick barrier material, like tantalum nitride, may line the contact via 306 to block moisture from the MOL layers, which can oxidize the barrier metal and cause bottom voids in the via. A thick barrier, however, results in a high via resistance.

As device geometries are reduced, the contact area between the contact via 306 and the metal interconnect 308 is also reduced. FIG. 3B, which is taken along a lengthwise direction of the metal interconnect 308, and 3C, which is taken along a widthwise direction, show the interface 310 between the bottom surface 312 of the metal interconnect 308 and the top surface 314 of the contact via 306. The smaller the contact area between the contact via 306 and the metal interconnect 308 is, the greater the contact via resistance will be, and this increased contact resistance will negatively impact the overall performance of the semiconductor device 300.

Figure 4A:
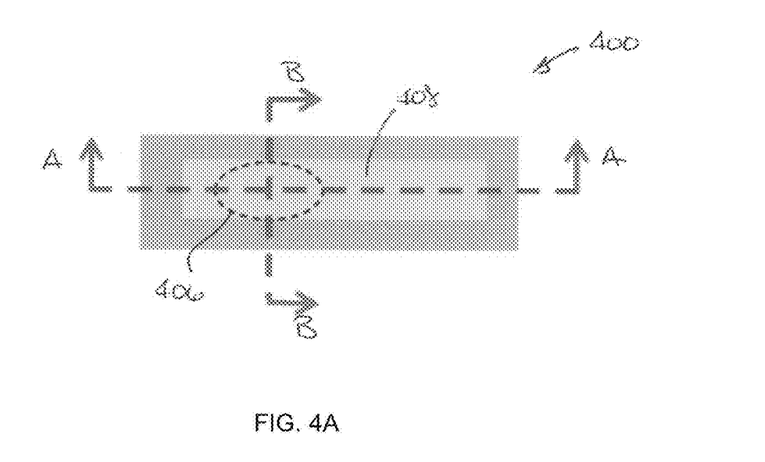
FIG. 4A is a top plan view of a portion of a semiconductor device in accordance with an aspect of the present disclosure
Figure 4B:
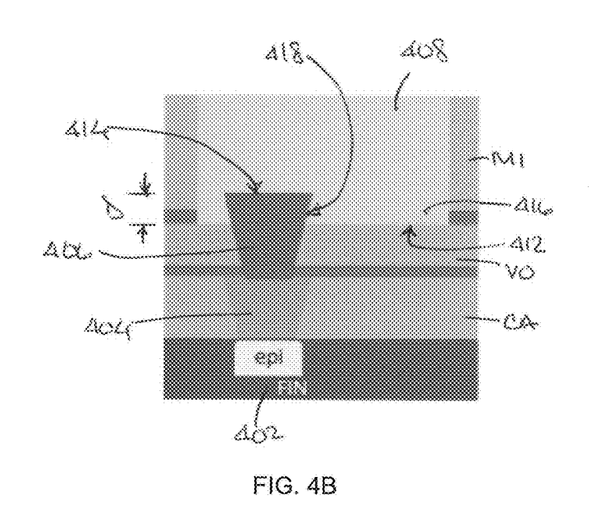
FIGS. 4B and 4C are cross-sectional views taken generally along the lines A-A and B-B, respectively, of FIG. 4A.
Figure 4C:
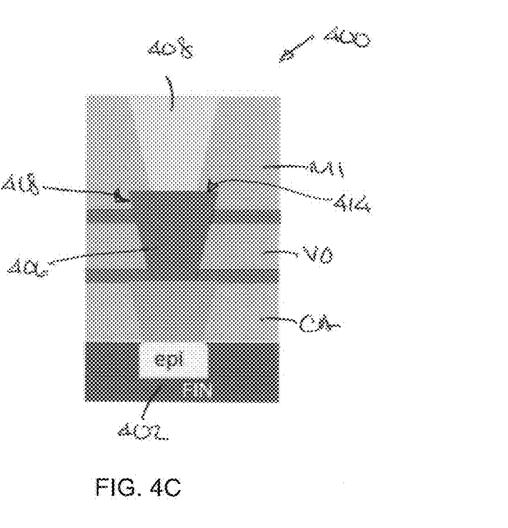

FIGS. 4A-4C illustrate a portion of a semiconductor device 400 in accordance with an aspect of the present disclosure. The semiconductor device 400 is similar fashion to the conventional semiconductor device 300 described with respect to FIG. 3. The semiconductor device 400 may include a FinFET 402, a contact 404 formed in the last MOL layer CA, and a metal interconnect 408 formed in the first BEOL layer M1. A contact via 406 in metal interconnect layer VO may electrically connect the FinFET 402, through the MOL contact 404 to the metal interconnect 408.

The contact via 406 and the metal interconnect 408 may be formed by a single damascene process, in which each layer (e.g., VO, M1) is processed and filled on its own. The contact via 406 may have a critical dimension (CD) of 20 nm and a height in the range of 20-40 nm. The contact via 406 and the metal interconnect 408 may be composed of a suitable metal, such as tungsten, cobalt, ruthenium, or copper, and may include suitable barrier metals or adhesion layers.

To reduce the resistance of the contact via 406, the metal interconnect 408 of the semiconductor device 400 may include a wraparound portion 416 that wraps around and is in contact with a sidewall 418 of the contact via 406. As illustrated in FIG. 4B, which is taken along a lengthwise direction of the metal interconnect 408, the wraparound portion 416 of the metal interconnect 408 extends below a top surface 414 of the contact via 406. Thus, for the wraparound portion 416, the bottom surface 412 of the metal interconnect 408 is below the top surface 414 of the contact via 406. Because the metal interconnect 408 contacts not only the top surface 414 of the contact via 406 but also some of the sidewall 418, the contact area between the contact via 406 and the metal interconnect 408 is increased, which reduces the resistance of the contact via 406.

The wraparound portion 416 of the metal interconnect 408 may extend below the top surface 414 of the contact via 406 by a depth D The depth D may extend to the full height of the contact via ontact 406. By way of example, the depth D may be in the range of 1-40 nm.

As illustrated in FIG. 4C, along the widthwise direction of the metal interconnect 408, the metal interconnect 408 does not contact the sidewall 418 of the contact via 406. Because numerous metal interconnects may be placed in close proximity to each other, to prevent shorting to adjacent metal interconnects, the wraparound portion 416 of the metal interconnect 408 only extends along the lengthwise direction of the metal interconnect 408.

Figure 5A:
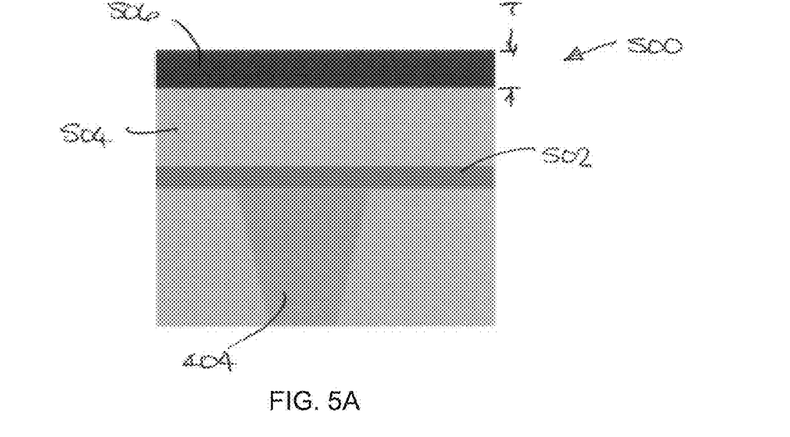
FIGS. 5A-5G are cross-sectional views taken along a lengthwise direction and illustrating the formation of a semiconductor device including a metal wrap-around structure in accordance with an aspect of the present disclosure.
Figure 5B:
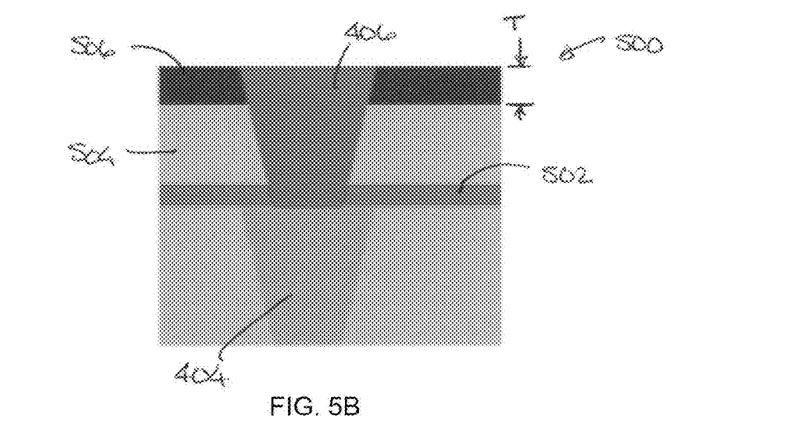
Figure 5C:
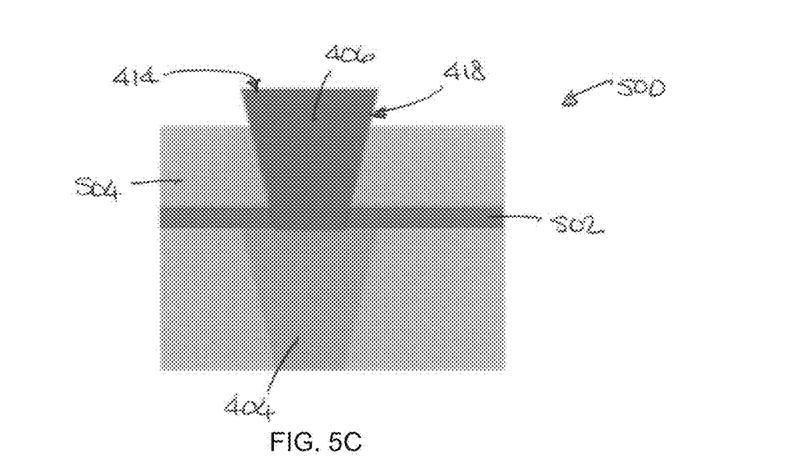
Figure 5D:
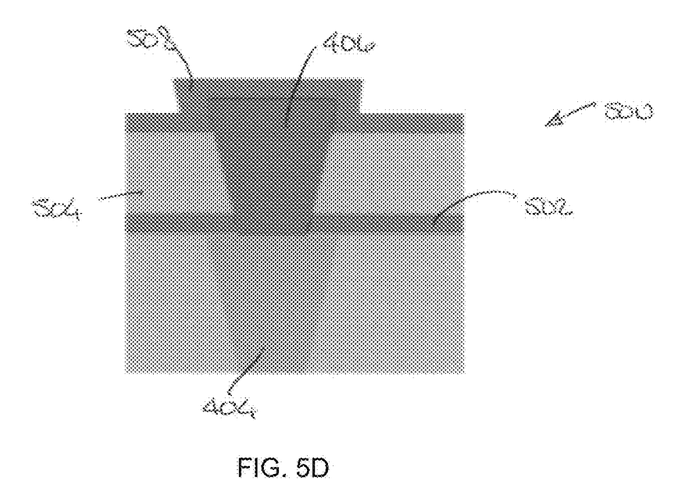
Figure 5E:
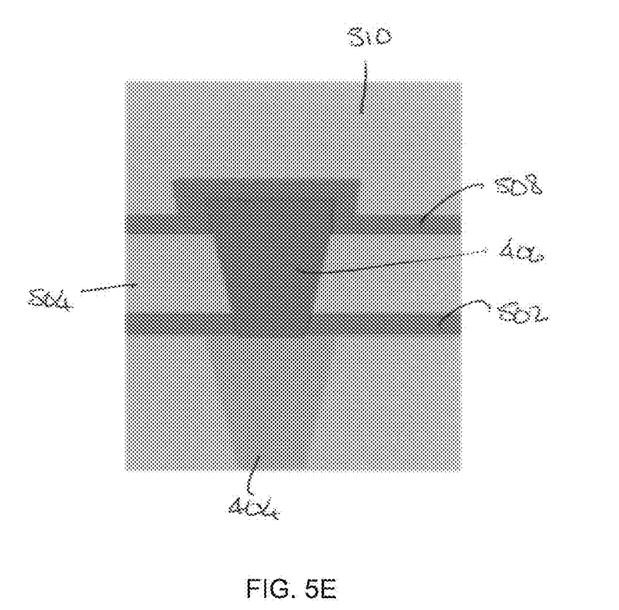
Figure 5F:
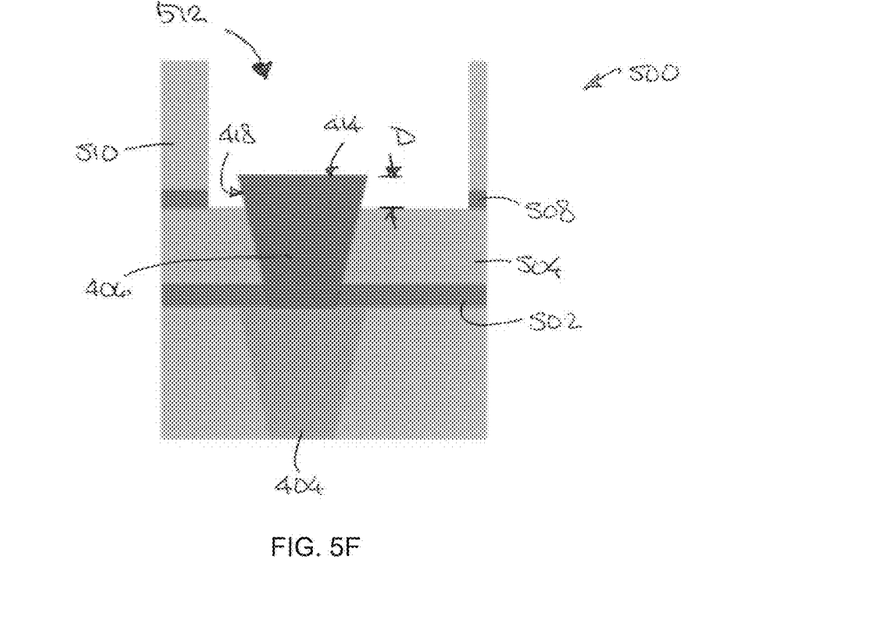
Figure 5G:
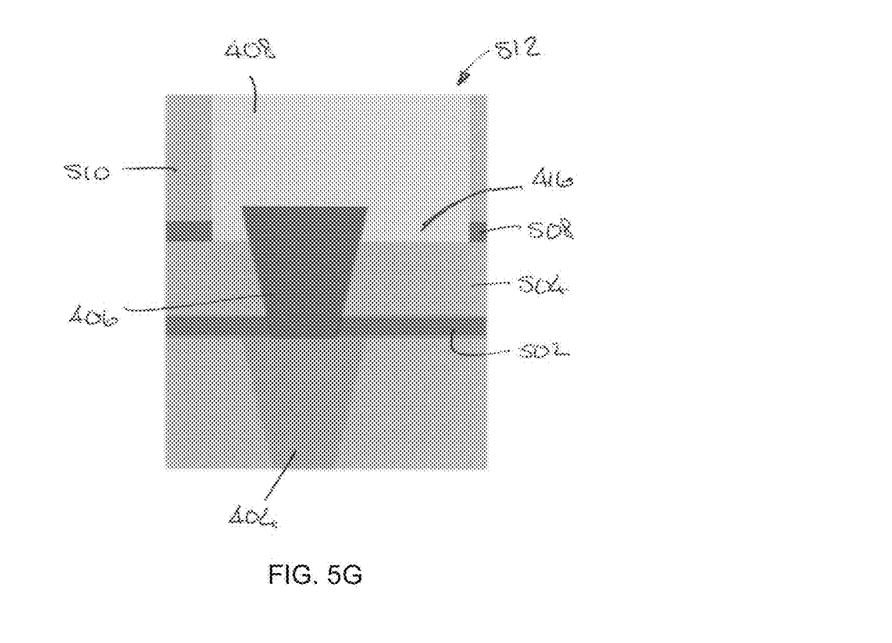
Figure 6A:
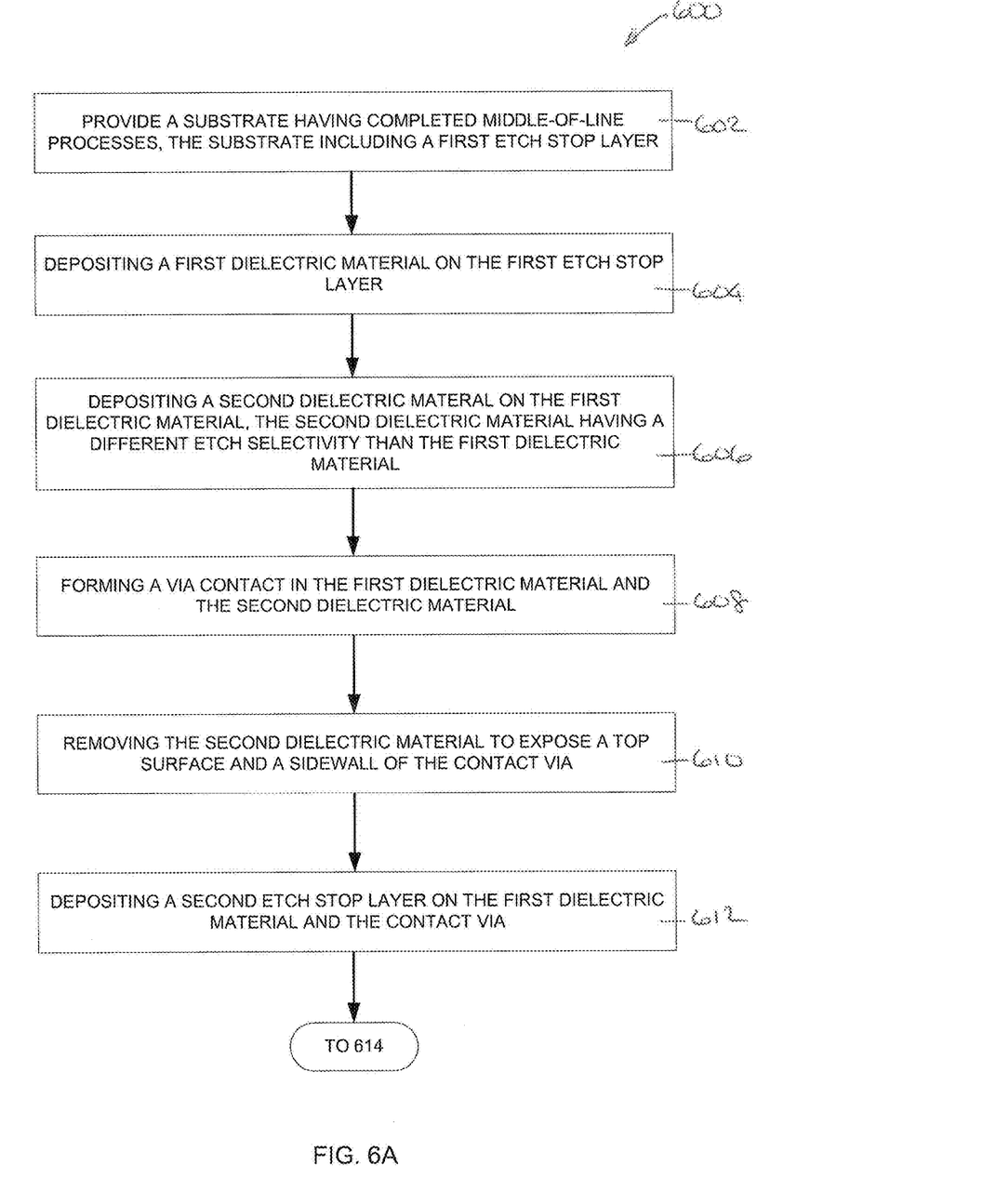
FIGS. 6A and 6B illustrate a method for fabricating a semiconductor device including a metal wraparound structure in accordance with aspects of the present disclosure.
Figure 6B:
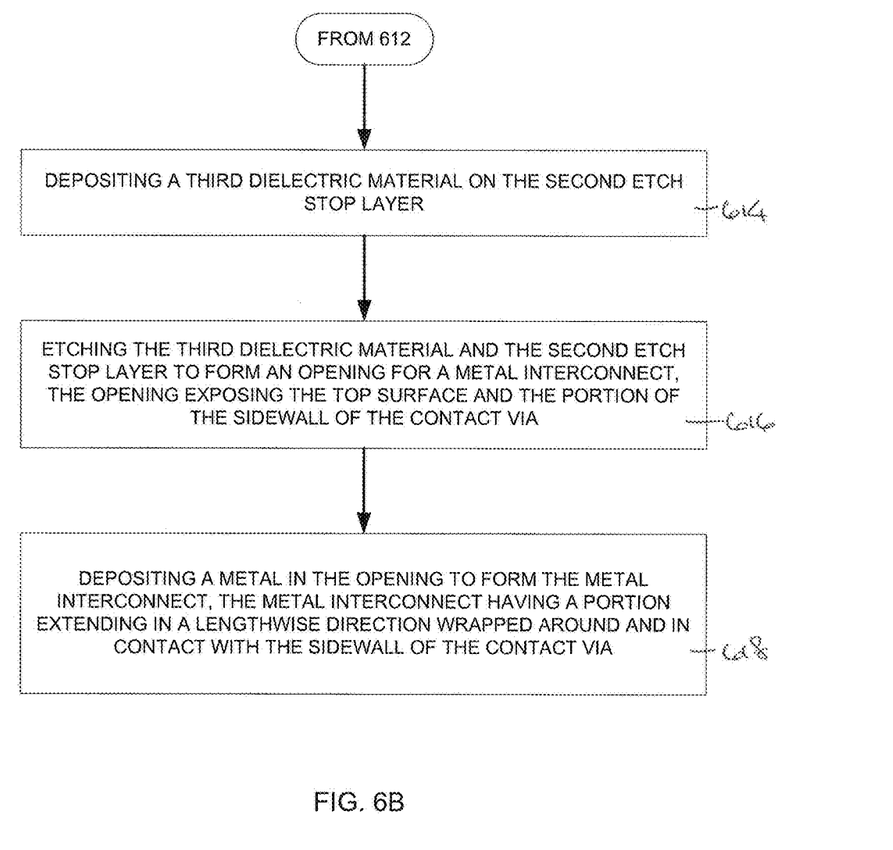

A process for forming the semiconductor device 400, as shown in FIGS. 5A-5G, is described with reference to FIGS. 6A and 6B. FIGS. 6A and 6B illustrate a method 600 for fabricating a semiconductor device including a metal wraparound structure according to aspects of the present disclosure. In block 602, a substrate having completed MOL processes is provided. The substrate may include a first etch stop layer as well as a MOL contact provided below the first etch stop layer. For example, as shown in FIG. 5A, a substrate 500 is provided with a MOL contact 404 and a first etch stop layer 502.

In block 604, a first dielectric material is deposited on the first etch stop layer. For example, as shown in FIG. 5A, a first dielectric material 504 is disposed on the first etch stop layer 502. The first dielectric material may be a low k dielectric material like SiCOH. In block 606, a second dielectric material is deposited on the first dielectric material. The second dielectric material preferably has a different etch selectivity than the first dielectric material. For example, as shown in FIG. 5A, a second dielectric material 506 is disposed on the first dielectric material 504. The second dielectric material 506 may be a low k dielectric material like SiN, which has a different etch selectivity than SiCOH. Alternatively, the second dielectric material 506 may be $SiO_2$ or SiON. It is the thickness T of the second dielectric material 506 that determines the depth D of the wraparound portion 416 of the metal interconnect 408. The thickness T of the second dielectric material 506 may be in the range of 1-40 nm.

Referring again to FIG. 6A, in block 608, a contact via is formed in the first and second dielectric materials. The contact via may be formed using a single damascene process, in which the first and second dielectric materials are etched to form a via opening. The via opening is then filled with metal and planarized to form the contact via. For example, as shown in FIG. 5B, the contact via 406 is formed in the first dielectric material 504 and the second dielectric material 506.

Referring again to FIG. 6A, in block 610, the second dielectric material is removed to expose a top surface and a sidewall of the contact via. The second dielectric material may be etched to remove it from the substrate 500. For example, as shown in FIG. 5C, the second dielectric material has been removed and the top surface 414 and the sidewall 418 of the contact via 406 are now exposed. The first dielectric material 504 remains, covering a lower portion of the contact via 406.

In block 612, a second etch stop layer is deposited on the first dielectric material and the contact via. For example, as shown in FIG. 5D, a second etch stop layer 508 is disposed on the first dielectric material 504 and the contact via 406. The second etch stop layer may be composed of SiCN and conformally grown on the substrate 500 to cover the first dielectric material 504 and the exposed sidewall 418 and top surface 414 of the contact via 406.

FIG. 6B further illustrates the method 600 for fabricating a semiconductor device including a metal wraparound structure according to aspects of the present disclosure. In block 614, a third dielectric material is deposited on the second etch stop layer. For example, as shown in FIG. 5E, a third dielectric material 510 is deposited on the second etch stop layer 508. The third dielectric material 510 may be any suitable low k dielectric material, such as SiCOH.

Referring again to FIG. 6B, in block 616, the third dielectric material and the second etch stop layer are etched to form an opening for a metal interconnect. The opening exposes the top surface and a portion of the sidewall of the contact via. For example, as shown in FIG. 5F, an anisotropic etch may be used form an opening 512 in the third dielectric material 510. After that the second etch stop layer 508 may be isotropically etch to remove the second etch stop layer 508 from the opening 512, exposing the top surface 414 and part of the sidewall 418 of the contact via 406.

Referring again to FIG. 6B, in block 618, a metal is deposited in the opening to from a metal interconnect. The metal interconnect includes a portion extending in a lengthwise direction that is wrapped around and in contact with the sidewall of the contact via to reduce the contact via resistance. The metal may any suitable metal, such as tungsten, cobalt, ruthenium, or copper and may further include barrier metals or adhesion layers. For example, as shown in FIG. 5G, the opening 512 has been filled with a metal and then planarized to form the metal interconnect 408. The metal interconnect 408 may be the first BEOL metal layer M1. The metal interconnect 408 includes a wraparound portion 416 that wraps around and is in contact with the sidewall 418 of the contact via 406 to reduce the resistance of the contact via 406 and improve overall performance of the resulting semiconductor device.

Aspects of the present disclosure include an innovative integration flow to form a metal wraparound structure to reduce the resistance between a metal interconnect and a contact via. The metal wraparound structure may enable operation within the reduced device geometries of advanced logic technologies, such as seven (7) nanometer logic technology and beyond. The metal wraparound structure may be fabricated using existing materials and process capabilities, while providing a substantial contact resistance reduction.

Figure 7:
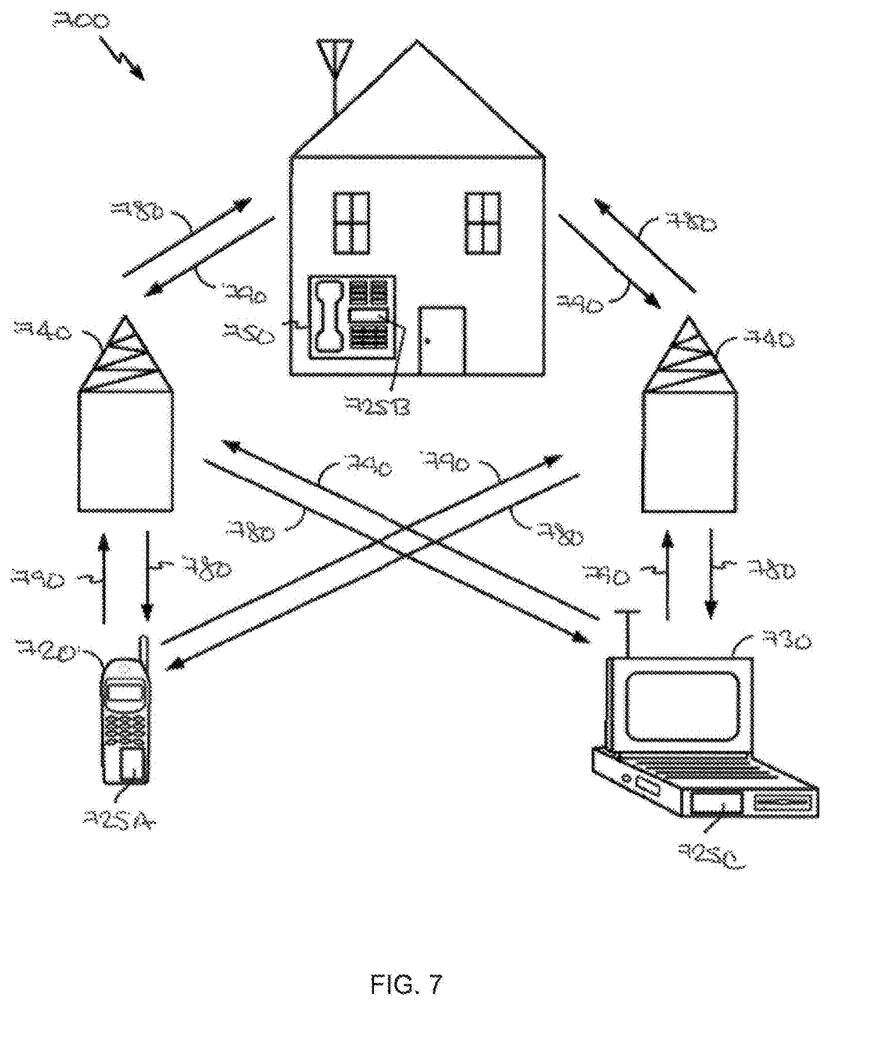
FIG. 7 is a block diagram showing an exemplary wireless communication system in which aspects of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B, respectively, that include the disclosed contacts. It will be recognized that other devices may also include the disclosed contacts, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed semiconductor devices.

Figure 8:
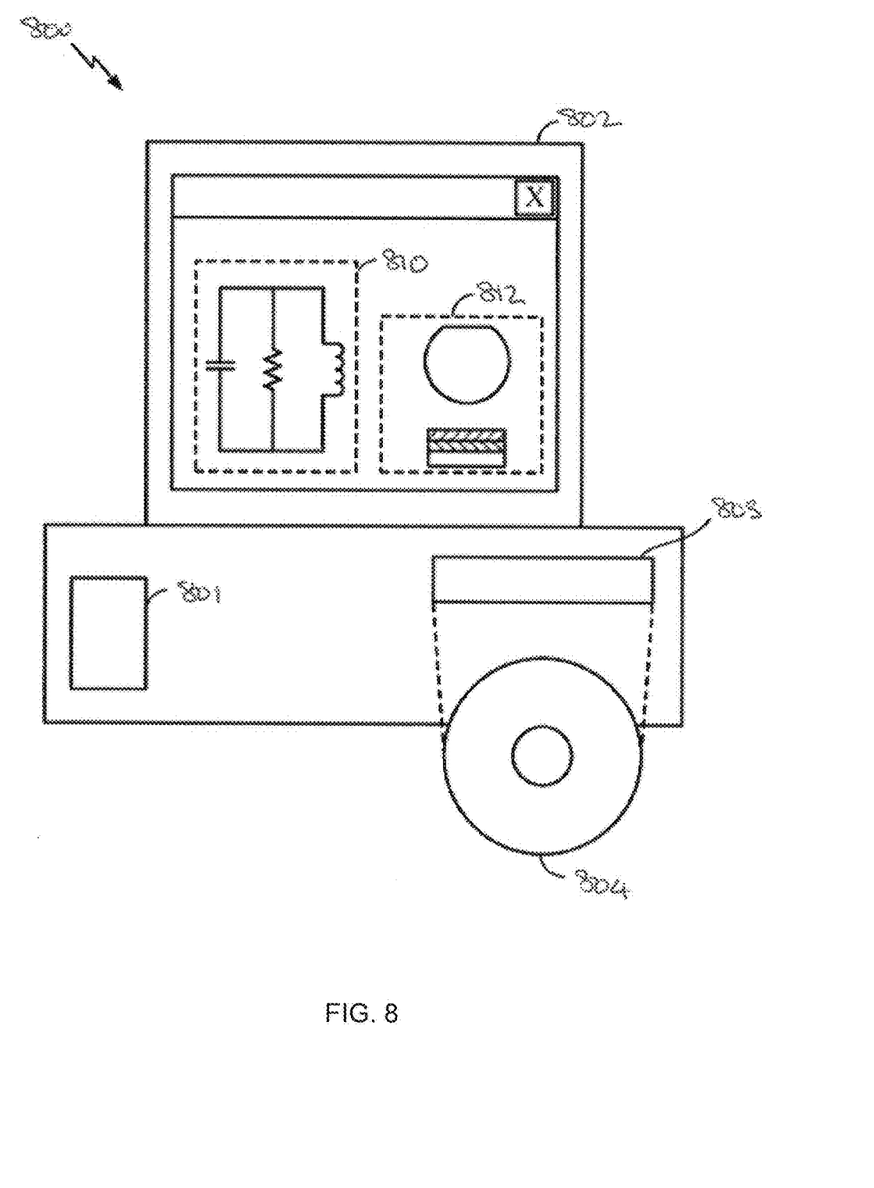
FIG. 8 is a block diagram illustrating a design workstation used for circuit, layout, and logic design of a fin-based structure according to one configuration.

FIG. 8 is a block diagram illustrating a design workstation used for circuit, layout, and logic design of a fin-based structure, such as the contacts disclosed above. A design workstation 800 includes a hard disk 801 containing operating system software, support files, and design software such as Cadence or OrCAD. The design workstation 800 also includes a display 802 to facilitate design of a circuit 810 or a fin-based structure 812 such as a contact. A storage medium 804 is provided for tangibly storing the design of the circuit 810 or the fin-based structure 812. The design of the circuit 810 or the fin-based structure 812 may be stored on the storage medium 804 in a file format such as GDSII or GERBER. The storage medium 1304 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the fin-based structure 812 by decreasing the number of processes for designing semiconductor wafers.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A semiconductor device, comprising:
   a contact via; and
   a metal interconnect on the contact via, the metal interconnect having a portion extending in a lengthwise direction wrapped around and in contact with a sidewall of the contact via, wherein along a widthwise direction the metal interconnect does not contact the sidewall of the contact via.

2. The semiconductor device of claim 1, wherein the portion of the metal interconnect extending in the lengthwise direction wrapped around and in contact with the sidewall of the contact via overlaps the contact via by a wrap depth in the range of 1 nm to 40 nm.

3. The semiconductor device of claim 1, wherein the metal interconnect is comprised of a metal selected from the group consisting of tungsten, cobalt, ruthenium, and copper.

4. The semiconductor device of claim 1, wherein the metal interconnect is a first back-end-of-line metal layer, and the contact via couples the metal interconnect with a middle-of-line contact.

5. The semiconductor device of claim 1 integrated into a mobile phone, a set top box, a music player, a video player, an entertainment unit, a navigation device, a computer, a hand-held personal communication systems (PCS) unit, a portable data unit, and/or a fixed location data unit.

* * * * *